(12) United States Patent
Ganjoo et al.

(10) Patent No.: US 9,463,999 B2
(45) Date of Patent: Oct. 11, 2016

(54) COATED GLASSES HAVING A LOW SHEET RESISTANCE, A SMOOTH SURFACE, AND/OR A LOW THERMAL EMISSIVITY

(71) Applicant: PPG INDUSTRIES OHIO, INC., Cleveland, OH (US)

(72) Inventors: Ashtosh Ganjoo, Allison Park, PA (US); David R. Haskins, Gibsonia, PA (US); James W. McCamy, Export, PA (US); Gary J. Nelis, Pittsburgh, PA (US); Peter Tausch, Decatur, IL (US)

(73) Assignee: PPG Industries Ohio, Inc., Cleveland, OH (US)

( * ) Notice: Subject to any disclaimer, the term of this patent is extended or adjusted under 35 U.S.C. 154(b) by 453 days.

(21) Appl. No.: 13/736,316

(22) Filed: Jan. 8, 2013

(65) Prior Publication Data

US 2013/0174892 A1    Jul. 11, 2013

Related U.S. Application Data

(60) Provisional application No. 61/584,837, filed on Jan. 10, 2012.

(51) Int. Cl.
*H01L 31/0224*     (2006.01)
*C03C 17/245*     (2006.01)
(Continued)

(52) U.S. Cl.
CPC ....... *C03C 17/2453* (2013.01); *C03C 17/3417* (2013.01); *C03C 17/3678* (2013.01);
(Continued)

(58) Field of Classification Search
CPC ............ C03C 17/002; C03C 17/2453; C03C 17/245; C03C 17/3417; C03C 16/545; C03C 16/401; C03C 16/402; C03C 16/453; C03C 2217/213; C03C 2217/23; C03C 2218/152
See application file for complete search history.

(56) References Cited

U.S. PATENT DOCUMENTS 3,107,177 A    10/1963    Saunders et al.
3,333,936 A    8/1967    Warren
(Continued)

FOREIGN PATENT DOCUMENTS

EP    1 061 586 A2    12/2000
WO    2010059507 A1    5/2010
WO    2011/047114 A1    4/2011

OTHER PUBLICATIONS

Stewart Engineering, Sputtered or Pyrolytic CVD Technology, Coating Technology—Processes, Dechnical Document CVD-00M-02, pp. 1-4 (2004).*

(Continued)

*Primary Examiner* — Jayne Mershon
(74) *Attorney, Agent, or Firm* — Andrew C. Siminerio (57) ABSTRACT

A glass sheet has an electrically conductive film having a sheet resistance in the range of 9.5 to 14.0 ohms/square; an emissivity in the range of 0.14 to 0.17 and an absorption coefficient of greater than $1.5 \times 10^3$ cm$^{-1}$ in the wavelength range of 400-1100 nanometers, and a surface roughness of less than 15 nanometers Root Means Square. A glass sheet of another embodiment of the invention has an electrically conductive film having a phosphorous-fluorine doped tin oxide pyrolytically deposited film on the surface of the glass sheet, wherein the ratio of phosphorous precursor to tin precursor is in the range of greater than 0-0.4. The coated glass sheets of the invention can be used in the manufacture of multi sheet insulating units, OLEDs and solar cells.

5 Claims, 6 Drawing Sheets

(51) Int. Cl.
  *H01B 1/08* (2006.01)
  *H05B 33/06* (2006.01)
  *C03C 17/36* (2006.01)
  *C03C 17/34* (2006.01)

(52) U.S. Cl.
  CPC ....... *H01B 1/08* (2013.01); *H01L 31/022466* (2013.01); *H01L 31/022475* (2013.01); *H05B 33/06* (2013.01); *C03C 2217/734* (2013.01); *C03C 2217/94* (2013.01); *C03C 2218/365* (2013.01); *Y10T 428/24942* (2015.01); *Y10T 428/265* (2015.01)

(56) References Cited

U.S. PATENT DOCUMENTS

| | | |
|---|---|---|
| 3,677,814 A | 7/1972 | Gillery |
| 4,402,722 A | 9/1983 | Edge |
| 5,356,718 A | 10/1994 | Athey et al. |
| 5,552,180 A | 9/1996 | Finley et al. |
| 5,655,282 A | 8/1997 | Hodek et al. |
| 5,772,716 A | 6/1998 | Krohm et al. |
| 5,863,337 A * | 1/1999 | Neuman et al. ............... 118/718 |
| 6,797,388 B1 | 9/2004 | Szanyi et al. |
| 6,833,194 B1 | 12/2004 | O'Shaughnessy |
| 7,663,300 B2 | 2/2010 | Hack et al. |
| 7,718,091 B2 * | 5/2010 | Zijp et al. ...................... 252/500 |
| 2009/0011206 A1 * | 1/2009 | Schutz et al. ................. 428/216 |
| 2009/0159880 A1 * | 6/2009 | Honda et al. .................... 257/43 |
| 2011/0023545 A1 * | 2/2011 | Liu et al. ....................... 65/60.2 |

OTHER PUBLICATIONS

Szanyi, The origin of haze in CVD tin oxide thin films, Applied Surface Science, vol./Issue 185, pp. 161-171 (2002).*

Joanne E. Stanley et al: "Atmospheric Pressure Chemical Vapor Deposition of Fluorine-doped Tin(IV) Oxide from Fluoroalkyltin Precursors", Applied Organometallic Chemistry, vol. 19, No. 5, Jan. 1, 2005, pp. 644-657, XP055077129.

PCT Search Report, PCT/US2013/020647, dated Sep. 10, 2013.

* cited by examiner

*SUNGATE 500 COATED GLASS*

FIG. 5

*ENHANCED COATED GLASS*

COATED GLASSES HAVING A LOW SHEET RESISTANCE, A SMOOTH SURFACE, AND/OR A LOW THERMAL EMISSIVITY

CROSS-REFERENCE TO RELATED APPLICATIONS

This application claims the benefits of U.S. Provisional Patent Application Ser. No. 61/584,837 filed Jan. 10, 2012 and titled COATED GLASSES HAVING A LOW SHEET RESISTIVITY, A SMOOTH SURFACE, AND/OR A LOW THERMAL EMISSIVITY. Application Ser. No. 61,584,837 in its entirety is incorporated herein by reference.

BACKGROUND OF THE INVENTION

1. Field of the Invention

This invention relates to coated glasses having a low sheet resistance, a smooth surface and/or a low thermal emissivity, and more particularly, to a pyrolytic fluorine doped tin oxide coating having a low sheet resistance, e.g. below 14 ohms/square, a smooth outer coating surface, e.g. an outer coating surface roughness of less than 15 nanometers ("nm") root mean square, and/or a low thermal emissivity.

2. Discussion of the Technology

As is appreciated by those skilled in the coating art, glass sheets are coated to, among other things, provide a coated glass having optical, physical and electrical properties different from the optical, physical and electrical properties of the uncoated glass. By way of illustration and not limiting to the discussion, a pyrolytic chemical vapor deposition ("CVD") coating of fluorine doped tin oxide deposited on glass provides a coated glass having visible and infrared transmission, percent haze, emissivity, surface roughness, and sheet resistance, e.g. sheet resistance different from the sheet resistance of the uncoated glass sheet.

Unfortunately, altering one set of properties can result in another set of properties to be outside a desired range. For example, and not limiting to the discussion, decreasing the sheet resistance of a fluorine doped tin oxide coating by increasing the coating thickness, e.g. as disclosed in column 3, lines 59-68 of U.S. Pat. No. 3,677,814 ("U.S. Pat. No. '814") increases the surface roughness. The limitation associated with increasing the surface roughness by increasing the coating thickness can be reduced by increasing the fluoride content of the organic tin composition, e.g. as disclosed in column 4, lines 30-34 of U.S. Pat. No. 3,107,177 ("U.S. Pat. No. '177"). The drawback with this technique is that large additions of fluorine, above a certain level, e.g., ammonium fluoride, are not effective, e.g. as disclosed in column 3, lines 41-53 of U.S. Pat. No. '814 in increasing the conductivity of the coating which reduces the sheet resistance.

As can now be appreciated, it would be advantageous to provide a technique to alter the properties of CVD fluorine doped tin oxide coating to, among other things, decrease sheet resistance with nominal increase in coating thickness; reduce the surface roughness of the coating and/or decrease the thermal emissivity of the coating.

SUMMARY OF THE INVENTION

This invention relates to a coated glass sheet including, among other things, a glass substrate, and an electrically conductive film over a surface of the glass substrate, the conductive film including, among other things, a sheet resistance in the range of 9.5 to 14.0 ohms/square; an emissivity in the range of 0.14 to 0.17 and an absorption coefficient of greater than $1.5 \times 10^3$ cm$^{-1}$ in the wavelength range of 400-1100 nanometers, and a Surface height mean square of less than 15 nanometers, wherein the properties are determined at a substrate thickness of 3.2 millimeters.

The invention further relates to a coated glass sheet including, among other things, a glass substrate, and an electrically conductive film over a surface of the glass substrate, the electrically conductive film including, among other things comprising a doped tin oxide pyrolytically deposited film on a surface of the glass substrate, wherein dopant of the doped tin oxide film is fluorine and a co-dopant or alloying constituent selected from the group of phosphorous, boron and mixtures of phosphorous and boron.

The invention still further an article of manufacture including, among other things, a glass substrate, and an electrically conductive film over a surface of the glass substrate, the conductive film selected from a group comprising Embodiment A, Embodiment B and Embodiment c, wherein the conductive film of Embodiment A includes, among other things, a sheet resistance in the range of 9.5 to 14.0 ohms/square; an emissivity in the range of 0.14 to 0.17 and an absorption coefficient of greater than $1.5 \times 10^3$ cm$^{-1}$ in the wavelength range of 400-1100 nanometers, and a Surface height root mean square of less than 15 nanometers, wherein the properties are determined at a substrate thickness of 3.2 millimeters; the conductive film of Embodiment B includes, among other things, a phosphorous-fluorine doped tin oxide pyrolytically deposited film over the surface of the glass sheet, wherein coating vapor of the deposited film comprises a tin precursor, a phosphorous precursor and a fluorine precursor, and the ratio of the phosphorous precursor to the tin precursor is in the range of greater than 0 to 0.4, and the conductive film of Embodiment C includes, among other things a boron-fluorine doped tin oxide pyrolytically deposited film over the surface of the glass sheet, wherein coating vapor of the deposited film comprises a tin precursor, a boron precursor and a fluorine precursor, and the ratio of the boron precursor to the tin precursor is in the range 0 to 0.4.

DETAILED DESCRIPTION OF THE INVENTION

As used herein, spatial or directional terms such as "inner", "outer, and the like, relate to the invention as it is shown in the drawing of the figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the property desired and/or sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all sub ranges subsumed therein. For example, a stated range of "1 to 10" should be considered to include any and all sub ranges between and inclusive of the minimum value of 1 and the maximum value of 10; that is, all sub ranges beginning with a minimum value of 1 or more and ending with a maximum value of 10 or less, e.g., 1 to 6.7, or 3.2 to 8.1, or 5.5 to 10. Also, as used herein, the term "mounted over" or "coated over" means over but not necessarily in surface contact with. For example, one article or component of an article "mounted over" or "coated over" another article or component of an article does not preclude the presence of materials between the articles, or between components of the article, respectively.

Before discussing several non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise, in the following discussion like numbers refer to like elements.

In general, but not limiting to the invention, the preferred non-limiting embodiments of the invention are directed to a doped tin oxide layer applied by a chemical vapor deposition (known in the art as "CVD") pyrolytic coating method on a soda-lime silica glass substrate to provide the glass substrate with initial properties that in subsequent embodiments of the invention are enhanced. For a full appreciation of the invention, specific non-limiting embodiments of the invention will be discussed separately. The specific embodiments of the invention relate to, but are not limited to, Section (1) directed to a crystalline doped tin oxide coating over or on a surface of a glass substrate; Section (2) directed to an amorphous doped tin oxide film coated on or over a surface of a glass substrate, and Section (3) directed to the use of the coated substrates of Sections (1) and (2).

Non-limiting embodiments of the invention will be directed to coatings applied to a soda-lime-silicate continuous glass ribbon made by the float process. The invention, however, is not limited thereto and the coating can be applied to any type of substrate, e.g. metal, plastic, glass of any composition that is structurally stable at or above the coating temperature, for example but not limited to 400 degrees Fahrenheit ("° F."). Further, the coating can be applied to glass having any shape, for example, but not limited to flat glass sheets, shaped glass sheets, e.g. but not limited to shapes for automotive windows, aircraft windows, home and commercial windows and windows for cabinets, e.g. refrigerators and ovens.

Figure 1:
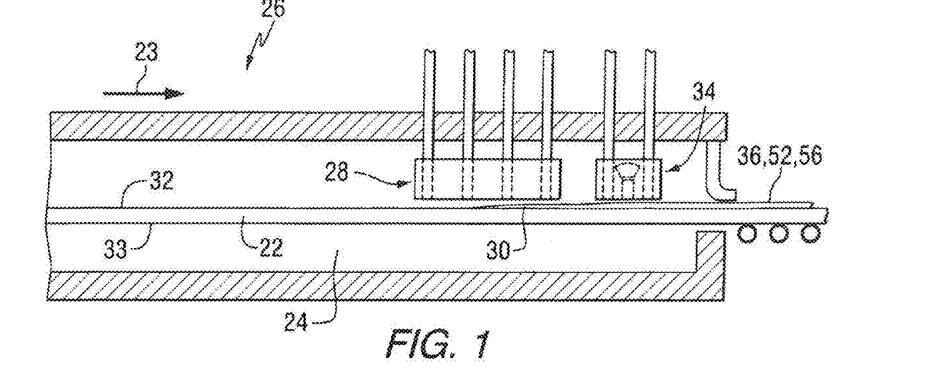
FIG. 1 is a cross-sectional view of the exit end of a float glass forming chamber that can be used in the practice of the invention.

Section (1): Non-Limiting Embodiments of the Invention Directed to a Crystalline Doped Tin Oxide Coating Over or on a Surface of a Glass Substrate In a preferred non-limiting embodiment of the invention, the doped tin oxide layer is a fluorine doped tin oxide layer applied over or on a color suppression layer by the CVD pyrolytic coating process (hereinafter also referred to as the "CVD process"). In the preferred practice of the invention, the doped tin oxide layer of the invention and the color suppression layer are applied to a surface of a continuous glass ribbon. More particularly, and with reference to FIG. 1, a continuous glass ribbon 22 floating on a pool of molten metal 24 moves in the direction of arrow 23. The pool of molten metal 24 is contained in a glass forming chamber 26, e.g. but not limited to the type disclosed in U.S. Pat. Nos. 3,333,936 and 4,402,722, which patents are hereby incorporated by reference. As the glass ribbon 22 moves under a first CVD coater 28, a color suppression film, an anti-iridescence film, or an underlayer film 30 is applied to surface 32 of the glass ribbon 22 (see also FIG. 2). The surface 32 of the ribbon 22 is opposite to surface 33 of the ribbon 22 supported on the pool 24 of molten metal. Continued movement of the glass ribbon 22 in the direction of arrow 23 moves the glass ribbon 22 under a second CVD coater 34 to apply a doped tin oxide film 36 (see FIG. 2) of the invention onto surface 38 of the color suppression film 30. As used herein, the term "color suppression" unless indicated otherwise includes "anti-iridescence".

In the preferred practice of the invention, the color suppression film 30 is a gradient layer of tin oxide and silicon oxide, and is of the type disclosed in U.S. Pat. Nos. 5,366,718 and 5,863,337, which patents are hereby incorporated by reference. The percent of silicon oxide in the color suppression film 30 decreases as the distance from the surface 32 of the glass ribbon 22 increases to provide a gradient color suppression film 30 having 95-100% silicon oxide at the surface 32 of the glass ribbon and 95-100% tin oxide at the surface 38 of the color suppression film 30 (see FIG. 2). For a detailed discussion of the chemistry and application of the color suppression film 30 reference can be made to U.S. Pat. Nos. 5,356,718 and 5,863,337.

Figure 3:
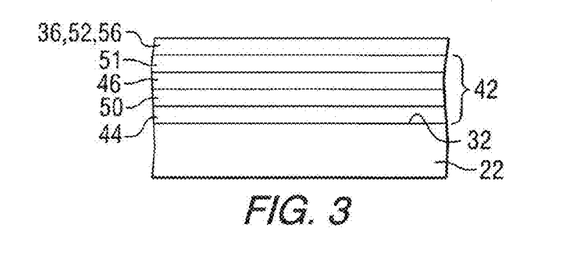
Figure 4:
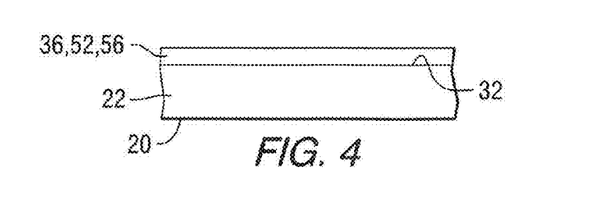

As can now be appreciated by those skilled in the art, the invention is not limited to a gradient color suppression film, and the invention contemplates a color suppression layer having a plurality of homogeneous silicon oxide and tin oxide films. More particularly and not limiting to the invention, shown in FIG. 3 is a color suppression layer 42 having tin oxide films 44 and 46 alternating with silicon oxide films 50 and 51. Optionally the color suppression film 30 and the color suppression layer 42 can be omitted, and the doped tin oxide film 36 of the invention can be applied directly to the surface 32 of the glass ribbon 22 as shown in FIG. 4.

For a full appreciation of this non-limiting embodiment of the invention, the doped tin oxide layer of the invention will be discussed applied to the mixed metal oxides film 30, however, the invention is not limited thereto and can be applied to the color suppression layer 42 (FIG. 3), or applied directly to the surface 32 of the glass ribbon (see FIG. 4). In the preferred practice of the invention, the doped tin oxide is fluorine-doped tin oxide, the invention, however, is not limited thereto and can be practice with other doped tin oxides, e.g. but not limited to tin oxides doped with antimony and mixtures of fluorine and antimony. At the present time there is available a coated glass product sold by PPG Industries, Inc. under the trademark Sungate® 500. The Sungate® 500 coated glass has the mixed metal oxides color suppression film 30 and a fluorine doped tin oxide layer 52.

For purposes of clarity the coated glasses of this non-limiting embodiment of the invention will be referred to as "Enhanced Coated Glass" or "ECG" and the Sungate® 500 coated glass will be referred to as "Standard Coated Glass". The properties of the Standard Coated Glass and the ECG of interest in the present discussion, but not limiting to the invention, are presented in Table 1 below.

TABLE 1

| PROPERTY | STANDARD COATED GLASS | ENHANCED COATED GLASS |
|---|---|---|
| Glass thickness | 3.2 millimeters | 3.2 millimeters |
| Sheet resistance | 20.0-22.0 ohms/sq[a] | 9.5-14.0 ohms/sq |
| Emissivity | 0.20-0.22 | 0.14-0.17 |
| Thickness Underlayer 30 | 80-100 nm[b] | 80-100 nm |
| F: SnO2 layer | 310-350 nm | 420-540 nm |
| Reflected Color[c] | | |
| a* | −6.0, +4.0 | −6.0, +4.0 |
| b* | 0.0, −10.0 | +3.0, −7.0 |
| L* | 37.0-41.0 | 37.0-41.0 |
| Haze[d] | Less than 1% | Less than 1% |
| Transmittance[e] | Greater than 82.0% | Greater than 80.0% |
| Surface roughness | Greater than 20 nm RMS | Less than 15 nm RMS[f] |
| Absorption Coefficient[g] | Greater than 1.9 × 10³ cm⁻¹ | Greater than 1.5 × 10³ cm⁻¹ |
| Coefficient of friction | Less than 1.2 | Less than 1.2 |

Notes:
[a]Abbreviation for "ohms/square".
[b]Abbreviation for "nanometers".
[c]Reflected Color is given in the L*, a*, b* coordinates, using CIE Illuminant D65, 10 degree Observer.
[d]The Standard Coated Glass usually has a measured haze in the range of 0.1-0.3%, and the ECG is expected to have a measured haze in the range of 0.4-0.6%.
[e]Transmittance is visible transmittance in the wavelength range of 380-780 nanometers ("nm"), using CIE Illuminant C, 2 degree Observer.
[f]RMS is an abbreviation for root means square. The RMS of the coated surface was measured using Atomic Force Microscopy.
[g]The absorption coefficient of the conductive coating layer is measured in a wavelength region between 400 and 1100 nm.

The thickness of the mixed metal oxide film 30 and the fluorine doped tin oxide films 36 and 52 were measured using a profilometer. The sheet resistivity was measured using a four point probe. The emissivity was determined from measurement of reflectance in the infrared wavelengths. The surface RMS was measured using atomic force microscopy. The reflected color is determined as described in ASTM E 308-90 and other international standards from measurement of reflectance in the range of 380 to 780 nm of the electromagnetic scale. The visible transmittance is in the range of 380 to 780 nm of the electromagnetic scale. The visible transmittance is measured using C.I.E. standard illuminant "C" with a 2 observer over a wavelength range of 380 to 780 nanometers.

The absorption coefficient was measured in the following manner. Methylene iodide with a refractive index of 1.79 was applied to a conductive film deposited on a glass sheet, and a cover piece of clear fused quartz with a thickness of 1 mm was allowed to adhere to the methylene iodide, thus producing a comparative sample in which a scattering loss due to surface roughness of the conductive film was no longer caused. The transmittance and reflectance of the comparative sample in the visible and near-infrared light region were measured using a spectrophotometer, and from these results the absorbance was determined. A reference sample was made by applying methylene iodide to a glass sheet with no conductive film being formed thereon and the cover glass was allowed to adhere, thus obtaining a reference sample. The glass sheet for the comparative sample and reference sample had the same composition. Similarly in this reference sample, the absorbance in the visible and near-infrared light region was determined as in the above. The absorption coefficient of the conductive film was determined by subtracting the absorbance of the reference sample from that of the comparative sample and solving an equation in which multiple reflections is taken into consideration. When the conductive film of the comparative sample was formed on an undercoating film, one in which an undercoating film was formed under the same conditions was used as a reference sample.

The coefficient of friction is measured according to the ASTM D-1894 test where a specimen is traversed under a 200 gram sled. The coefficient of friction is defined as the ratio Ft/Fn, where Ft is the normal force or the force which presses the two surfaces together (weight of the sled) and Fn is the tractive force required to initiate (static) and maintain (kinetic) relative motion between the surfaces. The test measures the resistance between the coating and the sled surface, where a high resistance indicates rougher surface and a low resistance indicates a smoother surface. In the practice of the invention, the coefficient of friction is preferably less than 1.2, more preferably less than 1.0 and most preferably less than 0.8

Figure 2:
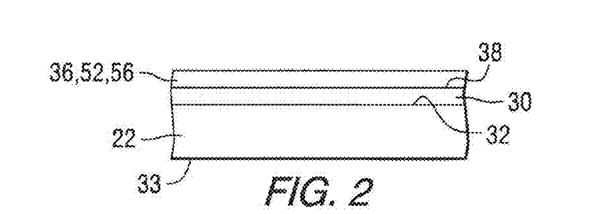
FIGS. 2-4 are side views of non-limiting embodiments of pieces of coated glass ribbons incorporating features of the invention.

The underlayer 30 of the ECG is similar to the underlayer 30 of the standard coated glass and each include the mixed metal oxides film 30 of $SiO_2$ and $SnO_2$ between a clear glass ribbon or substrate 22 and a fluorine doped tin oxide film; the fluorine doped tin oxide film for the ECG is designated by number 36, and the fluorine doped tin oxide film for the standard coated glass is designated by number 52 (see FIGS. 2-4). As discussed above, the mixed metal oxides film 30 and the fluorine doped tin oxide films 36 and 52 are applied by the CVD pyrolytic coating process.

The chemistry for the fluorine doped tin oxide film 36 for the ECG, and the fluorine doped tin oxide film 52 of the standard coated glass is presented in following Table 2.

TABLE 2

| CHEMISTRY | STANDARD COATED GLASS | ENHANCED COATED GLASS |
|---|---|---|
| | Chemistry Flows | |
| MBTC[h] | 28-30 (Lb/cell/hr)[i] | 42-48 (Lb/cell/hr) |
| TFA[j] | 4.5-8.0 (Lb/cell/hr) | 8.5-10.5 (Lb/cell/hr) |
| Water | 5-7 (Lb/cell/hr) | 11-13 (Lb/cell/hr) |
| CA[k] | 50 SCFM/cell[l] | 40 SCFM/cell |
| F/Sn[m] | 0.005-0.007 | Greater than 0.007-0.010 |
| F wt %[n] | 0.085-0.89 | 0.090-0.110 |

Notes:
[h]"MBTC" is the chemical abbreviation for monobutylin trichloride, which is the tin precursor.
[i]"Lb/cell/hr" is the abbreviation for "pounds per coating cell per hour".
[j]"TFA" is the chemical abbreviation for trifluoroacetic acid, which is the fluorine precursor.
[k]"CA" is the abbreviation for carrier air. In the practice of the invention, the carrier gas is air which is about 21% oxygen. The invention contemplates using other concentrations of oxygen up to and including 100%.
[l]"SCFM" is abbreviation for "standard cubic feet per minute".
[m]"F/Sn" is the atomic ratio of fluorine to tin in the fluorine doped tin oxide coating.
[n]"F wt %" is the weight percent of fluorine in the fluorine doped tin oxide coating.

One non-limiting embodiment of the ECG of the invention is an emissivity in the range of 0.14-0.17 and a sheet resistivity of 9.5 to 14.0 ohms/square. As is known in the art, the emissivity of a material is the relative ability of its surface to emit energy by radiation. It is the ratio of energy radiated by a particular material to energy radiated by a black body at the same temperature. A true black body would have an $\epsilon=1$ while any real object would have $\epsilon<1$. Emissivity is a dimensionless quantity. The Standard Coated Glass has an emissivity in the range of 0.20-0.22, and the ECG has an emissivity in the range of 0.14-0.17.

The lower emissivity range of the ECG can be obtained by increasing the amount of fluorine in, or by increasing the thickness of, the fluorine doped tin oxide layer. Increasing fluorine in the fluorine doped tin oxide layer increases the number of free electrons in the fluorine doped tin oxide layer and thus the conductivity and reflectivity of the fluorine doped tin oxide layer increases and the emissivity of the fluorine doped tin oxide layer decreases. From the above discussion, it can be appreciated that the emissivity, and sheet resistance, of the doped tin oxide layer are related to one another, and a measure of the sheet resistance can be used to approximate the emissivity of the doped tin oxide layer.

Using the fluorine doped tin oxide film 52 of the Standard Coated Glass as the starting point, the emissivity of the ECG can be obtained by increasing the thickness of the fluorine doped tin oxide film 52 of the Standard Coated Glass to increase the fluorine in the fluorine doped tin oxide film 36 of the ECG, and/or by increasing the fluorine to tin ratio ("F/Sn") in the fluorine doped tin oxide film 52 of the Standard Coated Glass to increase the fluorine in the fluorine doped tin oxide film 36 of the ECG.

The inventors recognized that the doped tin oxide layer is a crystalline layer and that increasing the thickness of the doped tin oxide layer increases the crystal size and increases haze. More particularly, increased crystal growth provides a rough surface that puts a drag on the material used to clean the surface of the doped tin oxide film 52. It has been observed that when the material is paper, e.g. paper towels, the rough surface of the tin oxide film 52 (see FIG. 2) can tear the paper towel as it is pulled across the surface of the fluorine doped tin oxide film 46.

The inventors further recognized that lowering the emissivity by increasing the F/Sn ratio has a limited ratio, e.g. read column 4, lines 30-34 of U.S. Pat. No. '177. In view of the forgoing, the emissivity of the ECG is attained by increasing the F/Sn atomic ratio to a value within the range of 0.006-0.010 and increasing the thickness of the fluorine doped tin oxide layer to thickness within the range of 500-540 nm. It was expected that increasing the thickness range of 310-350 nm of the fluorine doped tin oxide film 46 to the thickness range of 500-540 nm of the fluorine doped tin oxide film 36 of the ECG would increase the surface roughness of the ECG. However, the unexpected occurred. More particularly, the Standard Coated Glass having a thinner fluorine doped tin oxide film 52 than the fluorine doped tin oxide film 36 of the ECG had a surface roughness greater than 20 nm RMS, and the ECG had a surface roughness of less than 15 nm RMS.

Although it is not clearly understood, it is believed that the ECG has a thicker fluorine doped tin oxide film 36 and a lower surface roughness value than the Standard Coated Glass as a result of the interaction of the chemicals during deposition.

Figure 5:
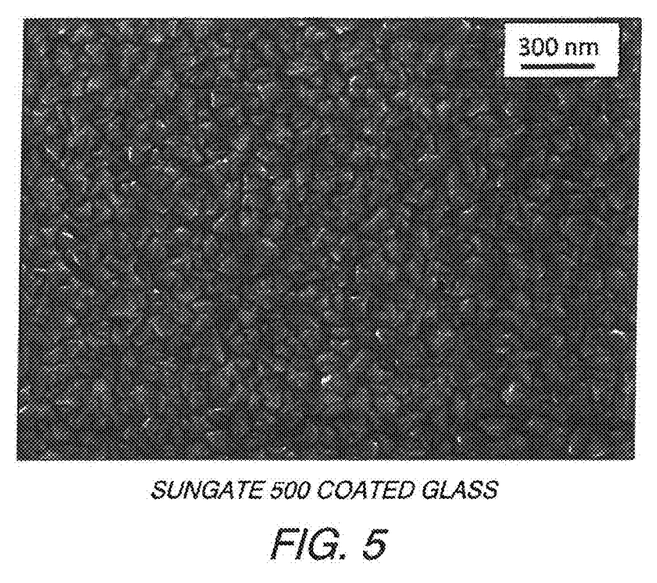
FIG. 5 is a copy of a photograph of crystal orientation of a fluorine doped tin oxide film of the prior art.
Figure 6:
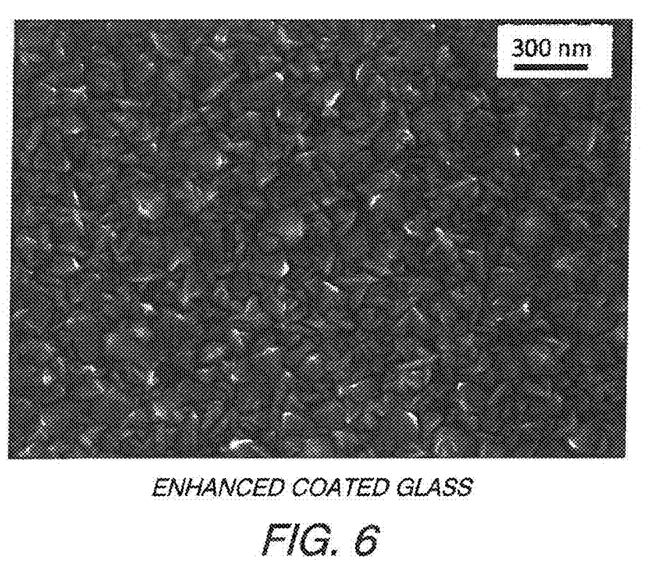
FIG. 6 is a copy of a photograph of crystal orientation of a fluorine doped tin oxide film of the invention.

More particularly, the flow per cell of the TFA is increased for the EFG to increase the incorporation of fluorine in the fluorine doped tin oxide film 36, and the flow per cell of the MBTC and the flow per cell of water is increased to increase the coating deposition rate of the MBTC and the thickness of the fluorine doped tin oxide film 36 of the ECG. Increasing the fluorine of the fluorine doped tin oxide film 36 for the ECG increases the F/Sn ratio to attain the desired emissivity and sheet resistance as discussed above. More particularly, the system for coating the Standard Coated Glass and for coating the Enhanced Coated Glass uses compressed air to move the vapors of the MBTC, TFA and water into the cell and uses nitrogen to move the mixed vapors of MBTC, TFA and water out of the cell toward the surface 32 of the glass ribbon 22 to deposit the fluorine doped tin oxide film 36 and 52 over the unsupported surface 32 of the glass ribbon 20. The total volumetric flow rate of coating vapors (vapors of MBTC, TFA and water), compressed air and nitrogen are maintained within a range of 50-75 SCFM. Increasing the vapor flow of the coating vapors requires decreasing the flow rate of the carrier air and/or nitrogen to remain within the total volumetric flow rate of 50-75 SCFM FIG. 5 is a copy of a photograph of the crystal structure of the Standard Coated Glass, and FIG. 6 is a copy of a photograph of the crystal structure of the ECG. The crystal structure of the ECG is more uniform in size and more compact than the crystal structure for the Standard Coated Glass. The proportion of crystallographic orientation of the crystals for the Standard Coated Glass is (200) followed by (110), and the orientation of the crystals for the ECG is (200) followed by (211). The crystal orientation was measured by $\Theta/2\Theta$ (theta/2theta) x-ray diffraction.

Coating the glass with the ECG chemistry, the Surface height of the ECG was reduced to provide the ECG with a smoother coated surface than the coated surface of the Standard Coated Glass.

The above numbers are for a glass ribbon having a thickness of 3.2 millimeters (see Table 1). As is appreciated by those skilled in the art, increasing the thickness of the glass ribbon, while maintaining the volume of glass produced, decreases the ribbon speed, and preferably the flow of the coating vapors is decreased to maintain the thickness of the color suppression film 30 and layer 42, and the thickness of the fluorine doped tin oxide films 36, 52. Further, decreasing the thickness of the glass ribbon increases the ribbon speed, and preferably the flow of the coating vapors is increased to maintain the thickness of the color suppression film 30 and layer 42, and the thickness of the fluorine doped tin oxide films 36, 52.

Section (2): Non-Limiting Embodiments of the Invention Directed to an Amorphous Doped Tin Oxide Film Coated on or Over a Surface of a Glass Substrate As discussed above in Section (1) the crystal structure of the ECG was altered by, among other things, making changes in the weight percent of the components of the coating chemistry and flow rate of the coating vapors while maintaining the fluorine doped tin oxide film 36 substantially crystalline. In this non-limiting embodiment of the invention, the crystal size of the fluorine doped tin oxide film 36 of the ECG and 52 of the Standard Coated Glass is reduced by adding dopants or alloying constituents, a g. phosphorus, boron and mixtures thereof, to the coating chemistry to change the crystal structure of the coating. Although the discussion of this non-limiting embodiment of the invention is directed to the addition of phosphorous to the fluorine doped tin oxide film 36 of the ECG, unless indicated otherwise the discussion is applicable to the fluorine doped tin oxide film 52 of the Standard Coated Glass, and any other type of conductive electrically conductive film deposited on a substrate.

As discussed above (see Table 2), the coating chemistry includes TFA, MBTC and water. In the non-limiting embodiment of the invention under discussion, the dopant added to change the crystalline structure of the fluorine doped tin oxide is phosphorous, and the phosphorus precursor is triethylphosphite (TEP). In this non-limiting embodiment of the invention under discussion, the crystal size of the fluorine doped tin oxide layer is reduced by increasing the TEP/MBTC ratio. As will be appreciated, the tin oxide film 56 having the additions of phosphorous can be deposited on or over the color suppression film 30 (FIG. 2), the layer 42 (FIG. 3), the layer of fluorine doped tin oxide film 56, between two layers of fluorine doped tin oxide film, and/or the surface 32 of the glass ribbon 20 (FIG. 4).

A discussion relating to the use of phosphorous as a breaker layer to reduce the growth of crystal size of a coating as the coating thickness increases is found in U.S. Pat. No. 6,797,388, which patent is incorporated herein by reference.

The following discussion is directed to the phosphorous-alloyed, fluorine doped tin oxide film 56 deposited on the color suppression film 30 shown in FIG. 2, however, the discussion is applicable, unless indicated otherwise, to depositing the phosphorous-fluorine doped tin oxide film 56 on the color suppression layer 42 (see FIG. 3) and/or on the surface 32 of the glass ribbon 20 (see FIG. 4). In one non-limiting embodiment of the invention, the tin precursor MBTC and the fluorine precursor TFA are vaporized and mixed with vapors of the phosphorous precursor TEP. The vapors of the MBTC, TFA, TEP, water and carrier gas are individually moved into a coating cell, mixed and the mixed vapors are moved out of the coating cells by the nitrogen gas as discussed above.

The chemistry for the EGG shown in Table 2 has a TEP/MBTC ratio of zero because there is no addition of TEP. As can be appreciated by those skilled in the art, as the ratio of TEP/MBTC increases the sheet resistance and the emissivity increase because adding phosphorous reduces the carriers and thus the conductivity. In one non-limiting embodiment of the invention, the TEP/MBTC ratio is in the range 0 to 0.4; preferably in the range 0 to 0.3; more preferably in the range of greater than 0 to 0.25, and most preferably, in the range 0.15 to 0.25.

The invention is not limited to the use of phosphorous to provide an amorphous doped tin oxide film. More particularly, the invention contemplates using boron and mixtures of phosphorous and boron. Boron precursors that can be used in the practice of the invention include, but are not limited triethyl borate and trimethyl borate. In one non-limiting embodiment of the invention, the boron precursor/MBTC ratio is in the range of greater than 0 to 0.4; preferably in the range 0 to 0.3; more preferably in the range 0 to 0.25, and most preferably, in the range 0.15 to 0.25.

In the discussion of the non-limiting embodiments of the invention presented in Sections 1 and 2 above, the glass ribbon had a thickness of 3.2 millimeters, however, the invention is not limited thereto, and the invention can be practiced on glass ribbon or moving substrates having any thickness, e.g. but not limited to 2.5 mm, 4.0 mm, 5.0 mm, 6.0 mm and 12.0 mm. As is appreciated by those skilled in the art of glass making, the ribbon or moving substrate speed decreases as the thickness of the ribbon or moving substrate increases, and the speed increases as the thickness of the ribbon or moving substrate decreases. Because of the change in ribbon or substrate speed, the flow rates of the coating precursors and mixed vapors is decreased as the glass ribbon thickness decreases and is increased as the glass ribbon thickness is increased to obtain similar or the same coating thickness as the ribbon speed or substrate speed changes for different glass thicknesses.

Changing the chemistry for CVD coating because of a change to glass ribbon thickness is well known in the art, and no further discussion is deemed necessary.

Section (3) Non-Limiting Embodiments of the Invention Directed to the Use of the Coated Substrates of Sections (1) and (2).

In this Section 3, the coating film 36 and 56 of the invention is discussed for use as a component of a window, an organic light emitting diode device (hereinafter also referred to as "OLED") and thin film solar cells, however, as is appreciated by those skilled in the art, the use of the coating film of the invention is not limited thereto and the coating film of the invention can be used in any article of manufacture where a functional coating film having electrical conductivity and/or low emissivity is a parameter of the article of manufacture. In the following discussion, reference is made to the coating film 36 of the invention applied over or on the gradient color suppression film 30 (shown in FIG. 2), however, unless indicated otherwise, the discussion is applicable to the coating film 56 of the invention, and the fluorine doped tin oxide film 52 of the Standard Coated Glass, over or on the color suppression film 36, and the coating films 36 and 56 of the invention, and coating film 52 of the Standard Coated Glass applied over or on the color suppression film 42 (shown in FIG. 3) or applied on or over a surface of the substrate (shown in FIG. 4).

Figure 7:
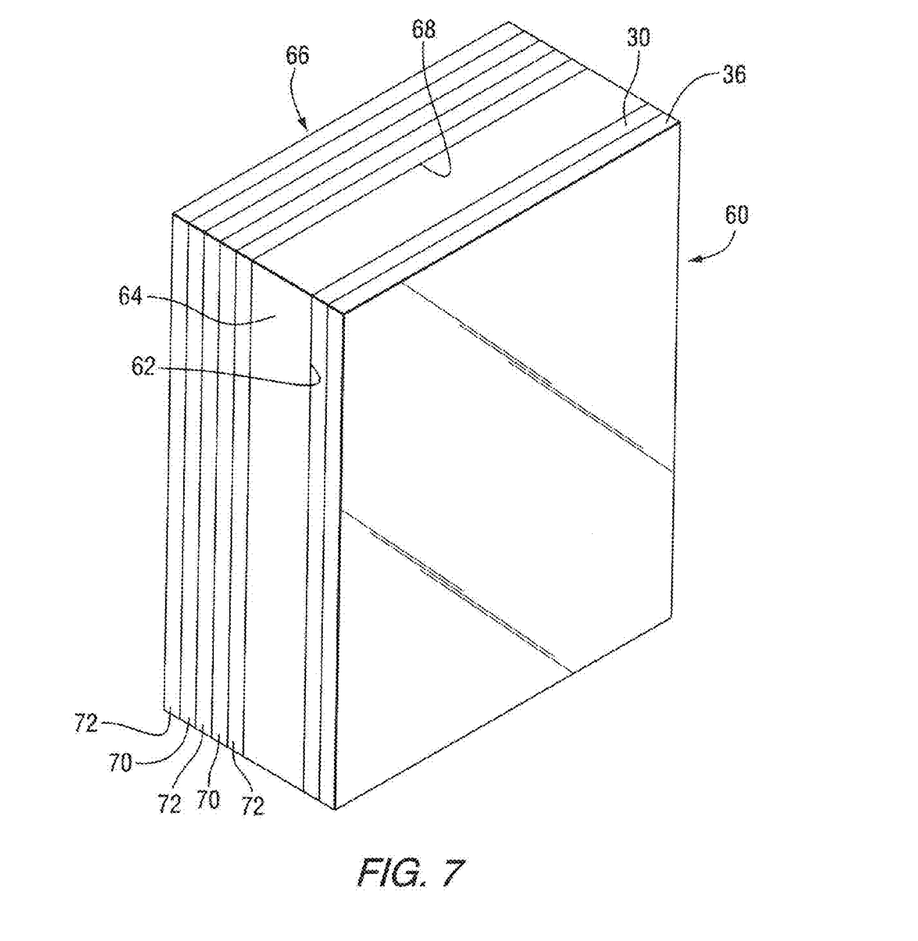
FIG. 7 is an isometric view of a coated glass sheet of the invention.

With reference to FIG. 7 there is shown a coated glass 60 incorporating features of the invention. The coated glass 60 includes the gradient color suppression film 30 applied to surface 62 of a glass substrate 64, and the fluorine doped tin oxide film 36 of the invention over the color suppression film 30. A solar control coating 66 is over surface 68 of the glass substrate 64 opposite to the surface 62 of the substrate 64. The invention is not limited to the solar control coating 66, and the coating 64 can be any of the types of solar control coatings known in the art, e.g. but not limited to pyrolytic CVD coatings, spray coatings and magnetron sputtered vacuum deposited ("MSVD") coatings. In the preferred embodiment of the invention, the coating 66 is an MSVD solar control coating 66, e.g. a low-e coating having one or more silver films 70 between dielectric films 72, e.g. but not limiting to the invention, low-e coatings of the type disclosed in U.S. Pat. Nos. 6,833,194 and 5,552,180, which patents are incorporated herein by reference.

As is appreciated by those skilled in the art, the MSVD coating 66 of the coated glass 60 is not as durable as the pyrolytically deposited coating 36, and the general practice is to secure the coated glass 60 with the MSVD coating 66 facing the interior of an insulating unit, e.g. but not limited to the insulating unit disclosed in U.S. Pat. No. 5,655,282, which patent is incorporated herein by reference. More particularly and with reference to FIG. 8, there is shown an insulating unit 76 incorporating features of the invention. The unit 76 includes a U-shaped spacer frame 78 having a moisture impervious adhesive layer 80 on outer surface 82 of legs 84 and 86 of the U-shaped spacer frame 78 to secure an uncoated glass sheet 88 to the surface 82 of the legs 84 of the spacer frame 78 and to secure the coated glass 60 to the outer surface 82 of the leg 86 of the spacer frame 78 with the MSVD coating 66 facing interior 90 of the unit 76. Further, as is appreciated by those skilled in the art, it is preferred, but not limiting to the invention, to remove the coating 66 from the marginal edges 92 of the surface 68 of the sheet 60 to provide a better moisture impervious seal between the surface 68 of the sheet 64 and the outer surface 82 of the leg 86 of the spacer frame 78. For a detailed discussion on the method of fabricating multi-sheet insulating units reference can be made to U.S. Pat. No. 5,655,282.

Figure 8:
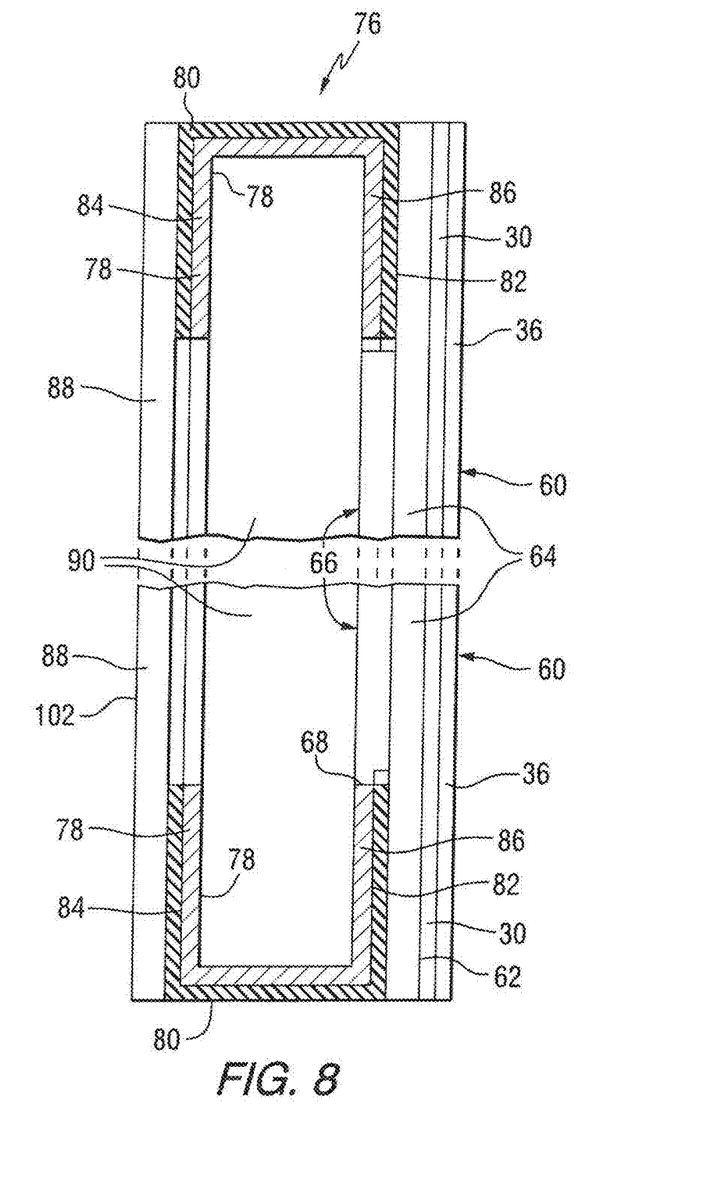
FIG. 8 is a sectional view of an edge assembly of a multi-sheet insulating unit incorporating features of the invention.
Figure 9:
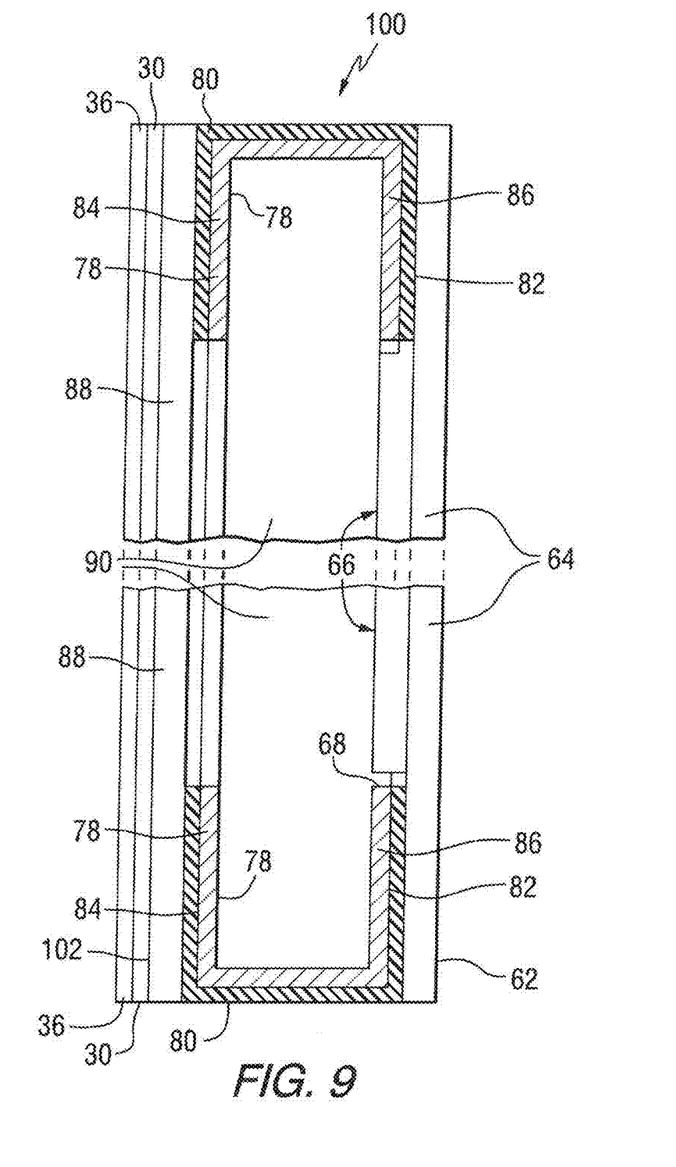
FIG. 9 is a cross sectional view of a multi-sheet unit incorporating features of the invention.

With reference to FIG. 9, there is shown another non-limiting embodiment of a multi-sheet unit of the invention designated by the number 100. The insulating unit 100 of FIG. 9 is similar, but not identical to the insulating unit in FIG. 8. More particularly, the color suppression layer 30 and the fluorine doped tin oxide film 36 is removed from the surface 62 of the glass substrate 64 of the coated sheet 66, and the color suppression layer 30 and the fluorine doped tin oxide film 36 is applied to outer surface 102 of the glass sheet 88.

In general, a multi sheet unit having only one surface of the four surfaces of the two glass sheets coated with the fluorine doped tin oxide film 36 is expected to have a center of glass (COG) R value of equal to or greater than 3; a multi sheet unit having only one surface of the four surfaces of the two glass sheets coated with the MSVD coating 64 is expected to have a COG R value of equal to or greater than 4, and a multi-sheet unit having one surface of the four surfaces of the two glass sheets coated with the fluorine doped tin oxide film 36 and a second surface of the four surfaces coated with the MSVD coating 64, e.g. as shown in FIGS. 8 and 9 is expected to have a COG R value of equal to or greater than 5.

The "R" value is a commercial unit used to measure the effectiveness of thermal insulation. The R value of a thermal insulator, e.g. a multi-sheet unit is defined to be 1 divided by the thermal conductance per inch as measured between outer surfaces of the insulating unit.

The discussion is now directed to using the doped tin oxide film of the invention as an anode for an OLED device. In the following discussion, reference is made to the coating film 36 of the invention applied over or on the gradient color suppression film 30 (shown in FIG. 2), however, unless indicated otherwise, the discussion is applicable to the coating film 56 of the invention, and the fluorine doped tin oxide film 52 of the Standard Coated Glass, over or on the color suppression film 36, and the coating films 36 and 56 of the invention, and coating film 52 of the Standard Coated Glass applied over or on the color suppression film 42 (shown in FIG. 3) or applied on or over a surface of the substrate (shown in FIG. 4).

Figure 10:
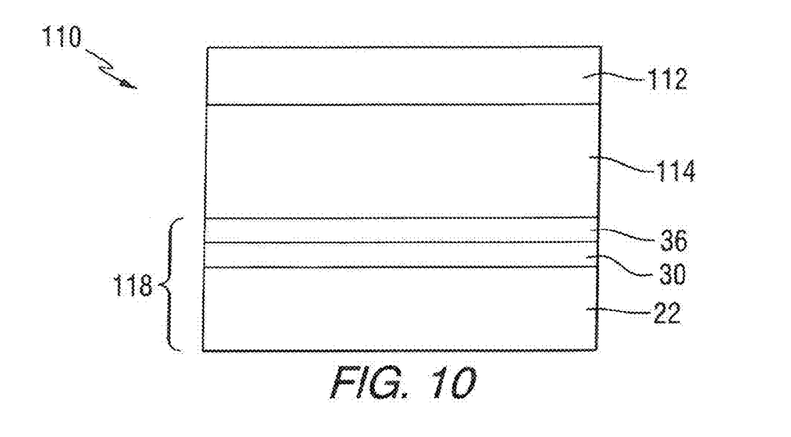
FIG. 10 is an elevated side view of an organic light emitting diode incorporating features of the invention.

An exemplary OLED device that can be used in the practice of the invention is described in U.S. Pat. No. 7,663,300, which patent is hereby incorporated by reference. An exemplary OLED designed by the number 110 is shown in FIG. 10. The OLED 110 includes a cathode (negative polarity) 112, which can be any conventional OLED cathode. Examples of suitable cathodes include metals, such as but not limited to, barium and calcium. The cathode typically has a low work function. An emissive layer 114 over or on the cathode can be a conventional organic electroluminescent layer as known in the art. Examples of such materials include, but are not limited to, small molecules such as organometallic chelates (e.g., Alq3), fluorescent and phosphorescent dyes, and conjugated dendrimers. Examples of suitable materials include triphenylamine, perylene, rubrene, and quinacridone. Alternatively, electroluminescent polymeric materials are also known. Examples of such conductive polymers include polyp-phenylene vinylene) and polyfluorene. Phosphorescent materials could also be used. Examples of such materials include polymers such as poly (n-vinylcarbazole) in which an organometallic complex, such as an iridium complex, is added as a dopant. An anode 118 of the OLED 110 can be a conductive, transparent material, such as a metal oxide material, such as, but not limited to, the doped tin oxide of the invention. The anode typically has a high work function.

With continued reference to FIG. 10, in the preferred practice of the invention, the anode (positive polarity) 118 includes the fluorine doped tin oxide layer 36 and the color suppression layer 30 on the glass substrate 22. The structure and operation of a conventional OLED device are well known in the art and will be understood by one of ordinary skill in the art without further discussion.

The discussion is now directed to using the doped tin oxide film of the invention as an electrode for a solar cell. In the following discussion, reference is made to the coating film 36 of the invention applied over or on the gradient color suppression film 30 (shown in FIG. 2), however, unless indicated otherwise, the discussion is applicable to the coating film 56 of the invention, and the fluorine doped tin oxide film 52 of the Standard Coated Glass, over or on the color suppression film 36, and the coating films 36 and 56 of the invention, and coating film 52 of the Standard Coated Glass applied over or on the color suppression film 42 (shown in FIG. 3) or applied on or over a surface of the substrate (shown in FIG. 4).

Figure 11:
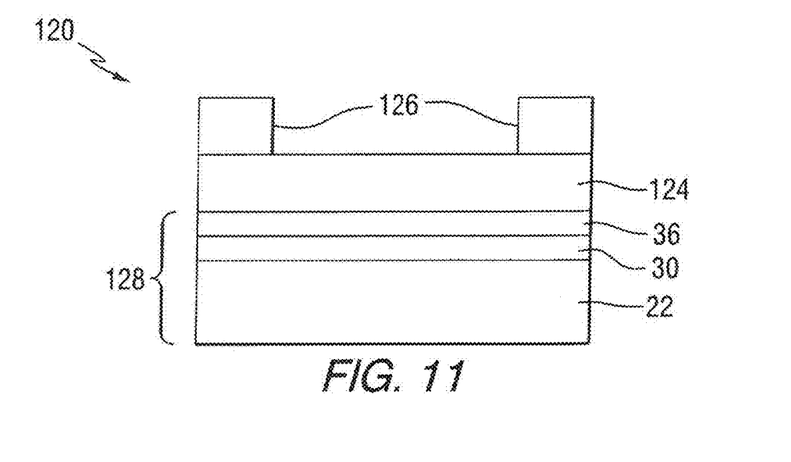
FIG. 11 is an elevated side view of a solar cell incorporating features of the invention.

Shown in FIG. 11 is a solar cell 120 have a photovoltaic cell 124 and electrodes 126 and 128. The electrode 128 includes the fluorine doped tin oxide film 36, the color suppression layer 30 and the glass substrate 22.

As can now be appreciated, the invention is not limited to the non-limiting embodiments of the invention presented herein and the features of the non-various limiting embodiments of the invention can be used with one another. It will further be readily appreciated by those skilled in the art that modifications can be made to the non-limiting embodiments of the invention without departing from the concepts disclosed in the foregoing description. Accordingly, the particular non-limiting embodiments of the invention described in detail herein are illustrative only and are not limiting to the scope of the invention, which is to be given the full breadth of the appended claims and any and all equivalents thereof.

What is claimed is:

1. A coated glass sheet comprising:
   a glass substrate having a surface;
   a pyrolytic chemical vapor deposited fluorine doped tin oxide film over the surface of the glass substrate, the pyrolytic chemical vapor deposited fluorine doped tin oxide film comprising a sheet resistance in the range of 9.5 to 14.0 ohms/square; an emissivity in the range of 0.14 to 0.17 and an absorption coefficient of greater than $1.5 \times 10^3$ cm$^{-1}$ in the wavelength range of 400-1100 nanometers, and a Surface height root mean square of less than 15 nanometers, wherein the properties are determined at a substrate thickness of 3.2 millimeters, and the pyrolytic chemical vapor deposited fluorine doped tin oxide film has a thickness of 500-540 nanometers and a fluorine to tin oxide atomic ratio of 0.006-0.010,
   wherein the pyrolytic chemical vapor deposited fluorine doped tin oxide film has a first surface and an opposite second surface, the first surface facing the glass substrate and the second surface facing away from the glass substrate, the second surface of the pyrolytic chemical vapor deposited fluorine doped tin oxide film comprises a crystalline surface, wherein orientation of the crystals of the pyrolytic chemical vapor deposited fluorine doped tin oxide film is (200) followed by (211) and are measured by $\Theta/2\Theta$ (theta/2theta) x-ray diffraction, wherein the crystal orientation of (200) followed by (211) provides the Surface height root mean square of less than 15 nanometers and the sheet resistance in the range of 9.5 to 14.0 ohms/square, and
   a color suppression layer comprising a gradient layer of mixed metal oxides between the pyrolytic chemical vapor deposited fluorine doped tin oxide film and the substrate.

2. The coated glass according to claim 1 wherein the surface of the pyrolytic chemical vapor deposited fluorine doped tin oxide film has a coefficient of friction of less than 1.2.

3. The coated glass according to claim 1 wherein the substrate having the pyrolytic chemical vapor deposited fluorine doped tin oxide film is an anode of an organic light emitting diode device hereinafter referred to as an "OLED", the OLED comprising an emissive layer and one or more light emitting layers between the anode and a cathode.

4. The coated glass according to claim 1 wherein the substrate having the pyrolytic chemical vapor deposited fluorine doped tin oxide film is an electrode for a solar cell device, the solar cell comprising a photovoltaic layer between the first electrode and a second electrode.

5. The coated glass according to claim 1 wherein the surface of the pyrolytic chemical vapor deposited fluorine doped tin oxide film has a coefficient of friction of less than 1.2.

\* \* \* \* \*